(12) United States Patent
Jin et al.

(10) Patent No.: US 12,525,982 B2
(45) Date of Patent: Jan. 13, 2026

(54) PHASE LOCK CIRCUIT

(71) Applicant: Microchip Technology Incorporated, Chandler, AZ (US)

(72) Inventors: Gary Qu Jin, Kanata (CA); Kamran Rahbar, Kanata (CA)

(73) Assignee: Microchip Technology Incorporated, Chandler, AZ (US)

( * ) Notice: Subject to any disclaimer, the term of this patent is extended or adjusted under 35 U.S.C. 154(b) by 363 days.

(21) Appl. No.: 18/205,008

(22) Filed: Jun. 2, 2023

(65) Prior Publication Data

US 2024/0223194 A1  Jul. 4, 2024

Related U.S. Application Data

(60) Provisional application No. 63/436,931, filed on Jan. 4, 2023.

(51) Int. Cl.
*H03L 7/093* (2006.01)
*H03L 7/07* (2006.01)
*H03L 7/099* (2006.01)

(52) U.S. Cl.
CPC ............ *H03L 7/093* (2013.01); *H03L 7/07* (2013.01); *H03L 7/0991* (2013.01)

(58) Field of Classification Search
CPC .......... H03L 7/093; H03L 7/07; H03L 7/0991
See application file for complete search history.

(56) References Cited

U.S. PATENT DOCUMENTS

| 6,091,303 A | * | 7/2000 | Dent | ................... H03L 7/23 327/147 |
| 9,319,051 B2 | | 4/2016 | Syllaios et al. | |
| 9,444,470 B2 | | 9/2016 | Milijevic | |
| 2008/0042702 A1 | * | 2/2008 | Ma | ................... G11C 29/02 327/552 |

(Continued)

FOREIGN PATENT DOCUMENTS

| CN | 104143976 A | * | 11/2014 | ............. H03L 7/093 |
| EP | 3340468 A1 | * | 6/2018 | ........... G01S 7/4008 |

(Continued)

OTHER PUBLICATIONS

Andersson, Fredrik et al., "Modelling and Characterization of an All-Digital Phase-Locked Loop," Thesis, Linköping University, Department of Science and Technology, URL: http://urn.kb.se/resolve?urn=urn:nbn:se:liu:diva-54441, 93 pages, Dec. 17, 2010.

(Continued)

*Primary Examiner* — Adam D Houston
(74) *Attorney, Agent, or Firm* — SLAYDEN GRUBERT BEARD PLLC

(57) ABSTRACT

A phase lock system includes a phase detector to detect a phase difference between a reference signal and the output of a controllable oscillator circuit. A loop filter may filter the output of the loop filter and an integrator may integrate the output of the loop filter. The integrator output may be added to the output of the loop filter and may be input to the controllable oscillator circuit and may modify at least one of the phase and frequency of the controlled oscillator output. A loop filter may enable a 40 dB-per-decade roll-off and improve attenuation of reference signal noise and local oscillator noise.

16 Claims, 12 Drawing Sheets

(56) References Cited

U.S. PATENT DOCUMENTS

| | | | |
|---|---|---|---|
| 2012/0076252 A1* | 3/2012 | Futami | H04L 27/0012 |
| | | | 375/376 |
| 2019/0097529 A1* | 3/2019 | Bhardwaj | H02M 1/4233 |
| 2022/0060191 A1 | 2/2022 | Roodnat | |
| 2024/0223194 A1* | 7/2024 | Jin | H03L 7/07 |

FOREIGN PATENT DOCUMENTS

| | | | | | |
|---|---|---|---|---|---|
| JP | H07336784 | A | * 12/1995 | | H03L 7/087 |
| JP | 2009115511 | A | * 5/2009 | | |
| KR | 20240178622 | A | * 12/2024 | | H03L 7/1075 |
| WO | WO-2021121637 | A1 | * 6/2021 | | H03L 7/07 |
| WO | WO-2022262995 | A1 | * 12/2022 | | H03L 7/23 |
| WO | WO-2024147799 | A1 | * 7/2024 | | H03L 7/0991 |

OTHER PUBLICATIONS

Partial International Search Report and Written Opinion, Application No. PCT/US2023/026286, 11 pages, Oct. 27, 2023.
International Search Report and Written Opinion, Application No. PCT/US2023/026286, 20 pages, Dec. 20, 2023.

* cited by examiner

PHASE LOCK CIRCUIT

PRIORITY

This application claims priority to commonly owned U.S. Patent Application No. 63/436,931 filed Jan. 4, 2023, the entire contents of which are hereby incorporated by reference for all purposes.

FIELD OF THE INVENTION

The present disclosure relates to phase lock circuits, including but not limited to phase-locked loops (PLLs).

BACKGROUND

In electronic systems, a phase lock circuit may be used to generate a clock source. The phase lock circuit may be a phase-locked loop (PLL). The PLL may comprise a phase detector, a loop filter, and a controllable oscillator circuit. The PLL may receive an input from a reference signal and may generate an output at the output of the controllable oscillator circuit.

A PLL may be designed to attenuate noise from several noise sources. High-frequency noise may be termed jitter, and low-frequency noise may be termed wander. In one of various examples, a PLL may be designed to attenuate noise in the reference signal, which may also be termed reference jitter. The loop filter may be designed as a low-pass filter with a low cutoff frequency to eliminate high-frequency noise in the reference signal. In one of various examples, a PLL may be designed to attenuate noise in the local oscillator circuit output. The loop filter may be designed as a high-pass filter to filter noise in the oscillator output.

A PLL may use a high-order loop filter to attenuate noise to a greater degree than with a first-order loop filter. A system designer must set the cut-off frequency of the loop filter to target a particular noise source—a low-pass filter to attenuate reference jitter, or a high-pass filter to attenuate local oscillator noise with the same cut-off frequency.

There is a need for a PLL which can achieve high-order attenuation of both reference noise and oscillator noise.

SUMMARY

The examples herein enable a phase-lock circuit which enables high-order attenuation of both reference signal jitter and oscillator jitter.

According to one aspect, a controllable oscillator circuit generates an oscillation signal. A phase detector circuit generates a phase difference output based upon a first input and a second input, the first input coupled to a reference signal, and the second input coupled to the oscillation signal generated by the controllable oscillator circuit. A loop filter with a frequency-selective roll-off filters the phase difference output to generate a filtered phase difference output. A multiplier applies a gain setting to the filtered phase difference output. An integrator integrates the output of the multiplier, an adder sums the filtered phase different output and the output of the integrator, wherein the controllable oscillator circuit modifies at least one of a phase and a frequency of the oscillation signal based upon the output of the adder.

According to one aspect, a system includes a first controllable oscillator circuit to generate a phase lock output. A first phase detector circuit generates a first phase difference output based upon a first input and a second input, the first input coupled to a reference signal and the second input coupled to the output of the first controllable oscillator circuit. A first loop filter with a frequency-selective roll-off filters the first phase difference output to generate a first filtered phase difference output. The first controllable oscillator circuit modifies at least one of a phase and a frequency of a first oscillator signal based upon a sum of the first filtered phase difference output and a second filtered phase difference output. A second controllable oscillator circuit generates an oscillation signal at an output of the second controllable oscillator circuit. A second phase detector circuit generates a second phase difference output based upon a first input and a second input, the first input to receive a second oscillator signal and the second input coupled to the output of the second controllable oscillator circuit. A second loop filter with a frequency-selective roll-off filters the second phase difference output to generate the second filtered phase difference output, and wherein the second controllable oscillator circuit modifies at least one of a phase and a frequency of the first oscillator signal based upon the second filtered phase difference output.

According to one aspect, the examples herein enable a method including operations of: receiving input from a reference signal, a first oscillator signal and a second oscillator signal, detecting a first phase difference between the reference signal and an output oscillation signal of a first controllable oscillator circuit to generate a first phase difference, detecting a second phase difference between the second oscillator signal and an output oscillation signal of a second controllable oscillator circuit to generate a second phase difference, filtering the first phase difference with a first frequency-selective filter, filtering the second phase difference with a second frequency-selective filter, driving the first controllable oscillator circuit with the first oscillator signal and an output of an adder, the adder to add outputs of the first frequency-selective filter and the second frequency-selective filter, and the output of the adder to modify at least one of a phase and a frequency of the output oscillation signal of the first controllable oscillator circuit, driving the second controllable oscillator circuit with the first oscillator signal and the output of the second frequency-selective filter, the output of the second frequency-selective filter to modify at least one of a phase and a frequency of the output oscillation signal of the second controllable oscillator circuit, and outputting the output oscillation signal of the first controllable oscillator circuit as a phase lock output.

BRIEF DESCRIPTION OF THE DRAWINGS

The figures illustrate examples of phase lock circuits.

DETAILED DESCRIPTION

Figure 1:
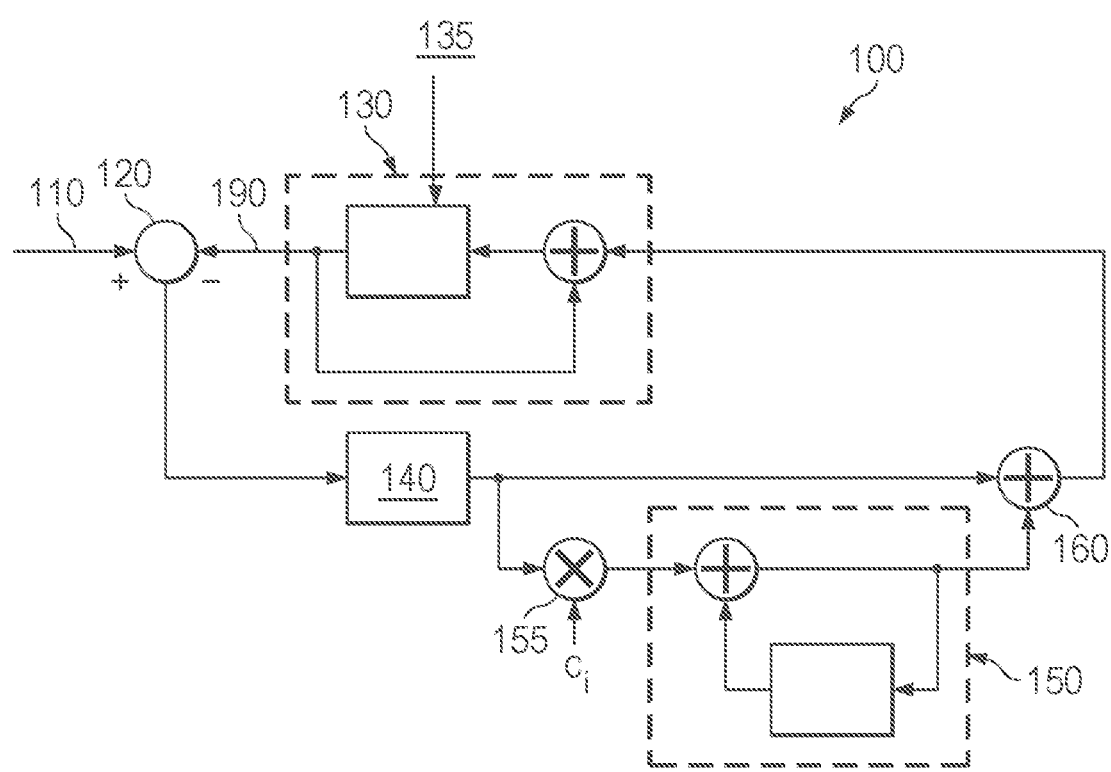
FIG. 1 illustrates one of various examples of a phase lock circuit.

FIG. 1 illustrates one of various examples of a phase lock circuit 100. Phase lock circuit 100 receives a reference signal 110. Reference signal 110 may be a periodic clock signal provided by a crystal oscillator or by another signal source. Reference signal 110 may include high-frequency noise. This noise may also be termed jitter. Phase detector circuit 120 may detect a phase difference between reference signal 110 and controllable oscillator output 190 of controllable oscillator circuit 130 and generate a phase difference output based on the phase difference between reference signal 110 and the controllable oscillator output 190 of controllable oscillator circuit 130. Controllable oscillator output 190 may be an oscillation signal. Local oscillator 135 may provide input to controllable oscillator circuit 130.

Loop filter 140 may receive the phase difference output of phase detector circuit 120 and may filter the phase difference output of phase detector circuit 120 to generate a filtered phase difference output as the loop filter output. Loop filter 140 may be a finite impulse response (FIR) or infinite impulse response (IIR) filter. Loop filter 140 may be a frequency-selective filter. The filter order and coefficients of loop filter 140 may set a specific frequency-selective roll-off and may determine the bandwidth of phase lock circuit 100. Gain setting 155 may be applied at the output of loop filter 140. Integrator 150 may integrate the output of gain setting 155 and may generate an integrated signal. Integrator 150 may apply a low-pass filter response to the output of loop filter 140. Output of integrator 150 may be a first input to adder 160, with the output of integrator 150 applied as a second input to adder 160. The output of adder 160 may provide an input to controllable oscillator circuit 130. Controllable oscillator circuit 130 may generate controllable oscillator output 190, and controllable oscillator circuit 130 may modify at least one of the phase and frequency of controllable oscillator output 190 based on the output of adder 160.

Controllable oscillator circuit 130 may be implemented as a chain of current-starved inverters, a chain of CMOS inverters with switched shunt capacitors, selectable multiplexers or another architecture not specifically mentioned. Controllable oscillator output 190 may be a signal in phase-lock with reference signal 110 through phase-lock circuit 100.

In one of various examples, the closed loop response of phase lock circuit 100 may be a low-pass response. Based on the design of phase lock circuit 100, a low-pass response may attenuate high-frequency noise from reference signal 110. Based on the design of phase lock circuit 100, a high-pass response may attenuate low-frequency noise from local oscillator 135 which supplies a clock for the entire circuit.

Figure 2:
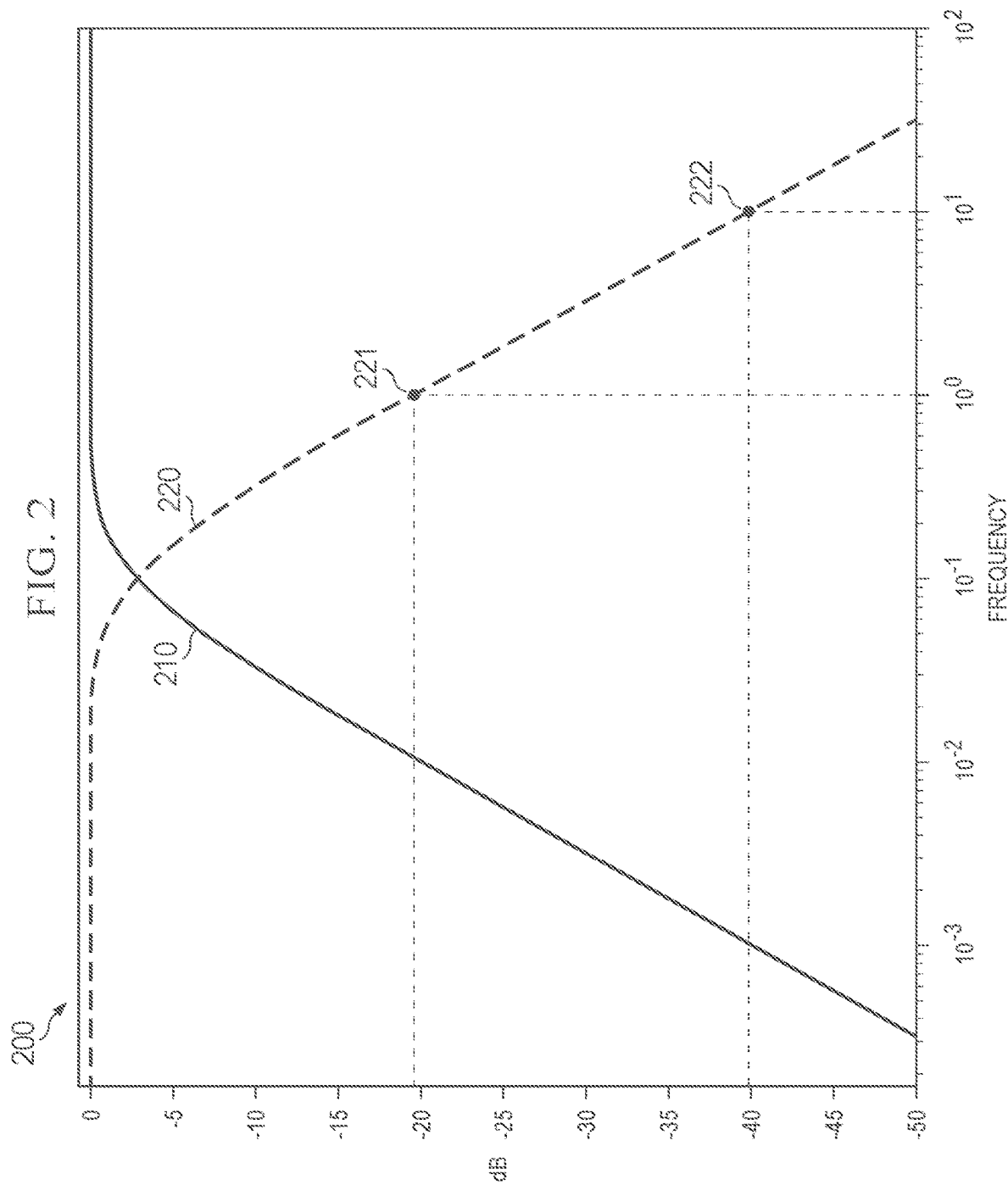
FIG. 2 illustrates one of various examples of a frequency response of a phase lock circuit.

FIG. 2 illustrates one of various examples of the frequency response 200 of a first-order phase lock circuit 100 according to the example illustrated in FIG. 1.

Trace 210 illustrates a frequency response of noise from the local oscillator 135 to the controllable oscillator circuit 130, measured at the controllable oscillator output 190. Phase lock circuit 100 may apply a high-pass response and may attenuate low-frequency noise from the local oscillator 135.

Trace 220 illustrates a frequency response of noise from reference signal 110, measured at the controllable oscillator output 190. Phase lock circuit 100 may apply a low-pass response and may attenuate high-frequency noise from the reference signal 110.

The frequency response illustrated in FIG. 2 represents the response of a first-order loop filter. The frequency response rolls off at 20 dB per decade, as indicated by points 221 and 222 in FIG. 2. Point 221 illustrates the response of trace 220 at a frequency of 1 Hz ($10^0$), and point 222 illustrates the response of trace 220 at a frequency one decade higher, at 10 Hz ($10^1$). The response is approximately −19 dB at point 221, and approximately −39 dB at point 222, which illustrates the 20 dB-per-decade roll-off of a first-order loop filter.

The frequency responses illustrated in trace 210 and trace 220 are illustrative and not intended to be limiting. A different design of loop filter 140 or a different value of gain setting 155 may result in responses with corner frequencies at different locations than the corner frequencies illustrated in FIG. 2.

Figure 3:
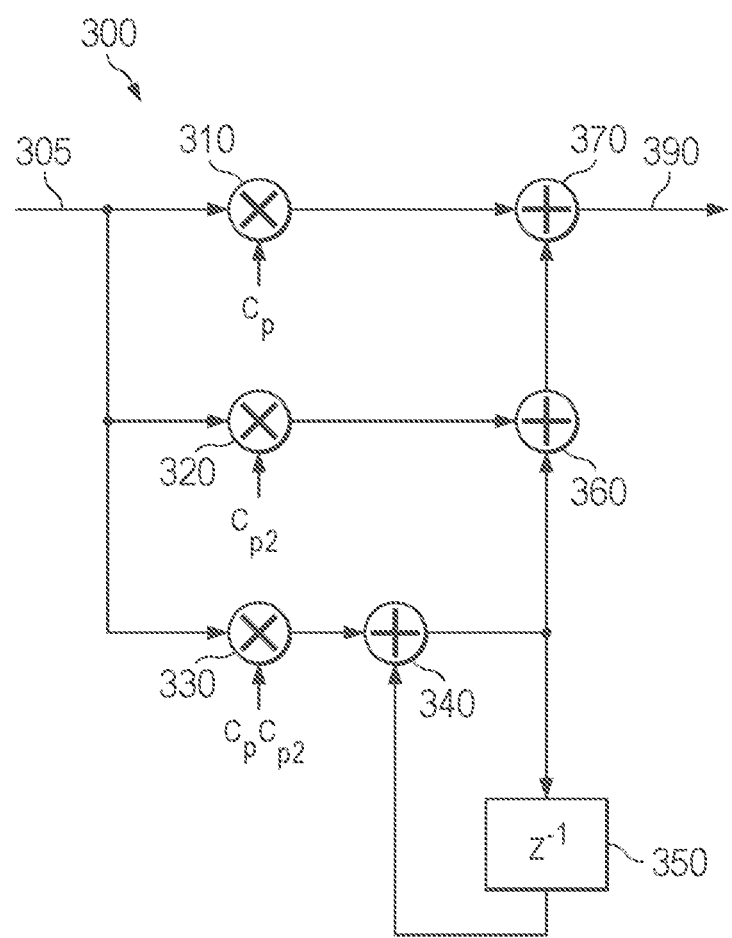
FIG. 3 illustrates one of various examples of a loop filter.

FIG. 3 illustrates one of various examples of a loop filter 300. Loop filter 300 may represent one of various examples of loop filter 140 as illustrated in FIG. 1. Input signal 305 may be provided to loop filter 140. Input signal 305 may be coupled to a plurality of gain circuits. In the example illustrated in FIG. 3, input signal 305 may be coupled to three gain circuits, but this is not intended to be limiting.

In the example illustrated in FIG. 3, first gain circuit 310 may apply a gain setting of $C_p$. The output of first gain circuit 310 may be input to first adder 370. Second gain circuit 320 may apply a gain setting of $C_{p2}$. The output of second gain circuit 320 may be input to a first input of second adder 360. Third gain circuit 330 may apply a gain setting of $C_p*C_{p2}$. The output of third gain circuit 330 may be input to a first input of third adder 340. The value of $C_{p2}$ may define a second pole in the response of loop filter 300 and may define a frequency at which the loop filter 300 rolls off at a 40 dB/decade rate.

The output of third gain circuit 330 may be input to a first input of third adder 340. The second input of third adder 340 may be coupled to the output of delay circuit 350. The output of third adder 340 may be coupled to the input of delay circuit 350 and to a second input of second adder 360. The feedback path from the output of third adder 340 to delay circuit 350 to the second input of third adder 340 may implement an integration function.

The output of second gain circuit 320 may be coupled to a second input of second adder 360.

The output of first gain circuit 310 may be input to a first input of first adder 370. The output of second adder 360 may be coupled to a second input of first adder 370. The output of first adder 370 may be loop filter output 390.

Figure 4:
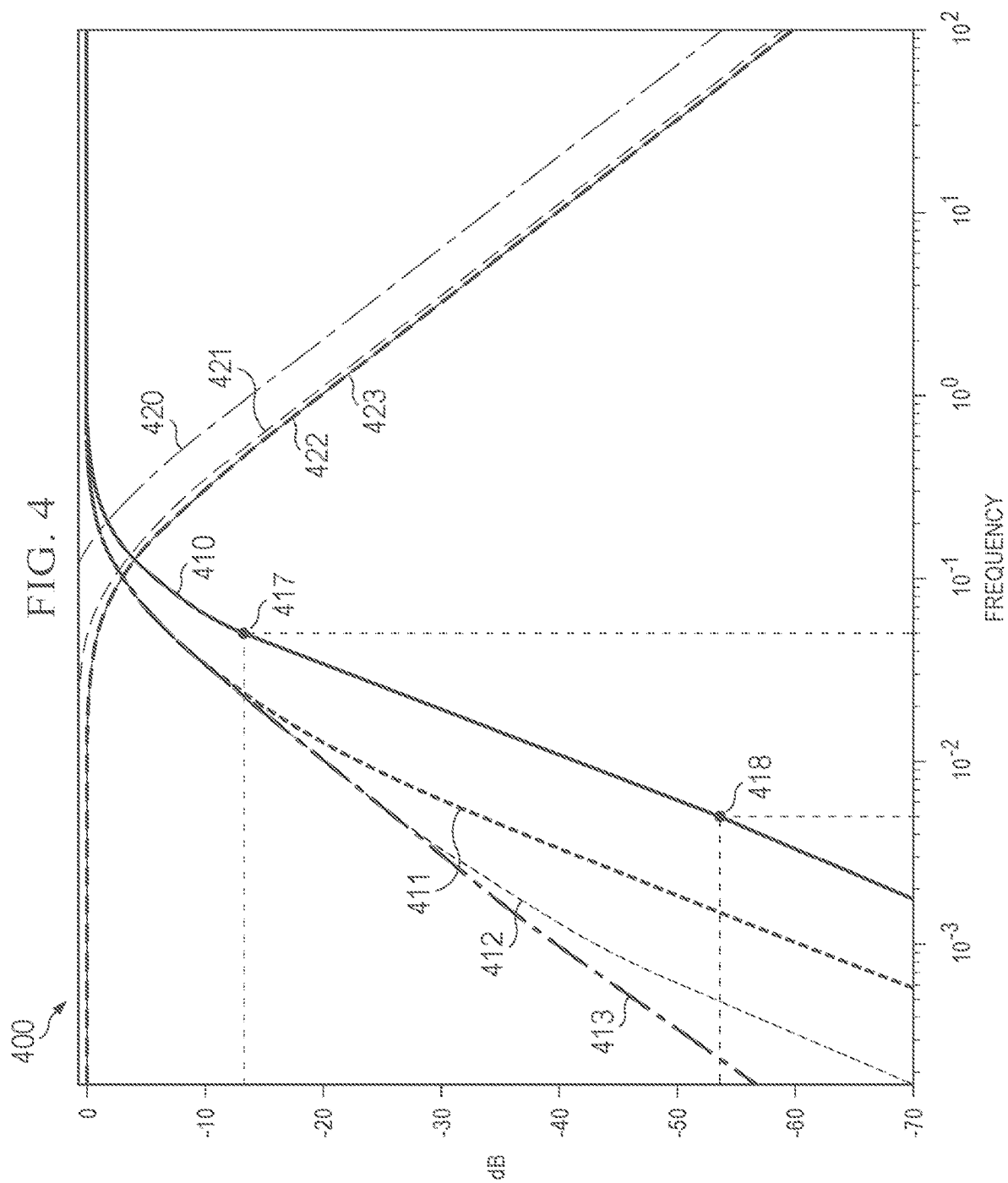
FIG. 4 illustrates one of various examples of a frequency response of a phase lock circuit.

FIG. 4 illustrates one of various examples of a frequency response 400. Frequency response 400 may represent the response of one of various examples of phase lock circuit 100 as described in reference to FIG. 1, phase lock circuit 100 including loop filter 300 as described in reference to FIG. 3.

Traces 410, 411, 412 and 413 may illustrate a frequency response of noise from controllable oscillator circuit 130, as measured at controllable oscillator output 190, for different implementations of loop filter 300. Traces 410, 411, 412, and 413 may illustrate a frequency response for a loop filter 300 with different values of coefficients $C_p$ and $C_{p2}$. Loop filter 300 may apply a high-pass response to noise from the local oscillator 135 and may attenuate low-frequency noise from the local oscillator 135. Traces 420, 421, 422 and 423 may illustrate a frequency response of noise from reference signal 110, as measured at controllable oscillator output 190, for different implementations of loop filter 300. Traces 420, 421, 422 and 423 may illustrate a frequency response for a loop filter 300 with different values of coefficients $C_p$ and $C_{p2}$. Loop filter 300 may apply a low-pass response to noise from reference signal 110 and may attenuate high-frequency noise from reference signal 110.

Loop filter 300 may apply attenuation with a 40 dB-per-decade roll-off to the noise from the local oscillator 135, as indicated by points 417 and 418 in FIG. 4. Point 417 illustrates the response of trace 410 at a frequency of 5*10-1 Hz, and point 418 illustrates the response of trace 410 at a frequency one decade lower, at 5*10-2 Hz. The response is approximately −13 dB at point 417, and approximately −53 dB at point 418, which illustrates the 40 dB-per-decade roll-off of loop filter 300. A similar roll-off can be seen for traces 420, 421, 422 and 423.

Figure 5:
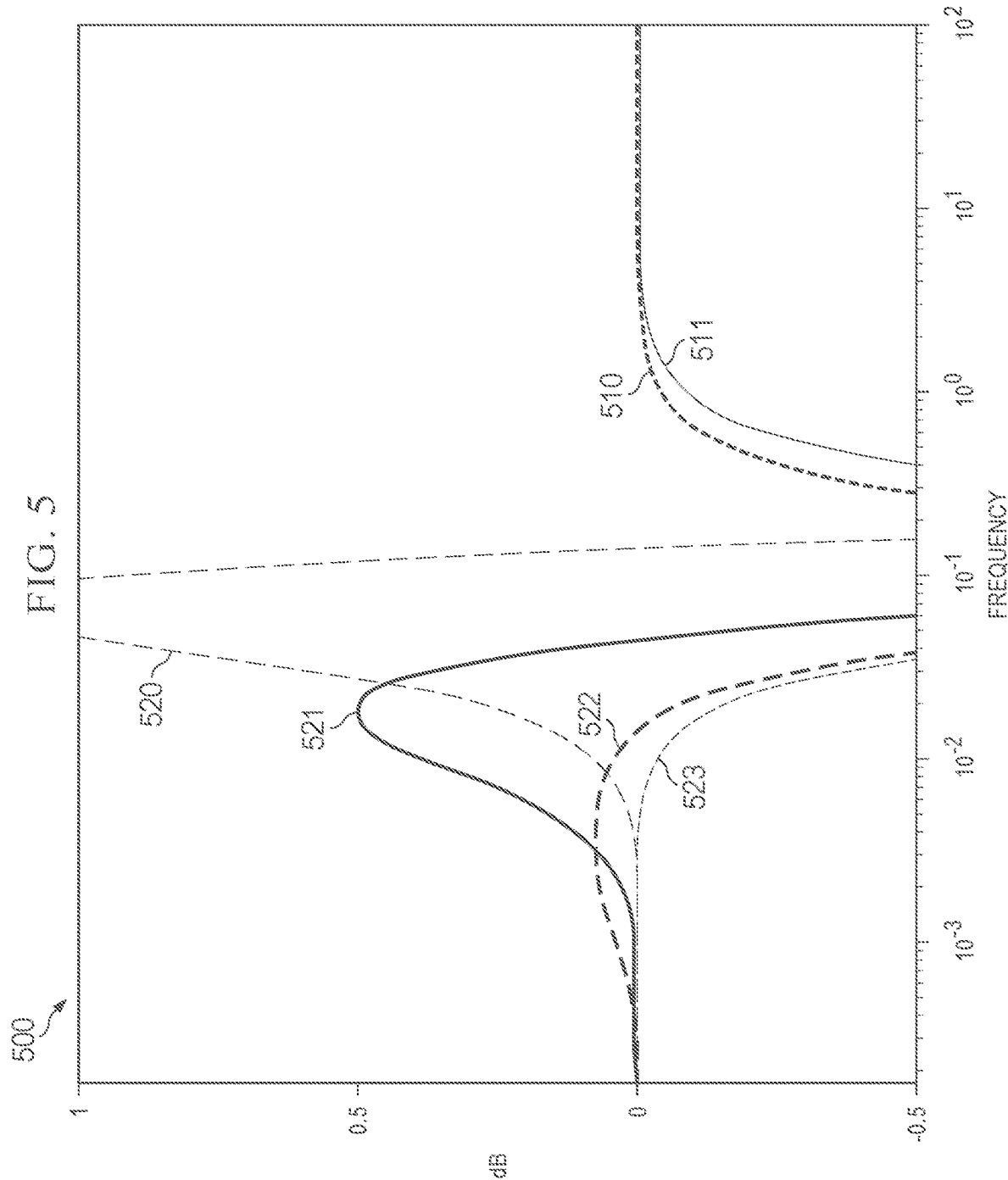
FIG. 5 illustrates a zoomed-in view of the frequency response of FIG. 4.

FIG. 5 illustrates a zoomed-in view 500 of frequency response 400. Note that the vertical axis in FIG. 5 spans −0.5 dB to 1 dB, where the vertical axis in FIG. 4 spans −70 dB to 0 dB. Traces 520, 521, 522 and 523 illustrate varying levels of overshoot in the frequency response for noise from controllable oscillator circuit 130 for different implementations of loop filter 300. Traces 510 and 511 illustrate varying levels of roll-off in the frequency response for noise from reference signal 110 for different implementations of loop filter 300. Different values for the gain settings in first gain circuit 310, second gain circuit 320 and third gain circuit 330 may result in different overshoot and roll-off characteristics.

Figure 6:
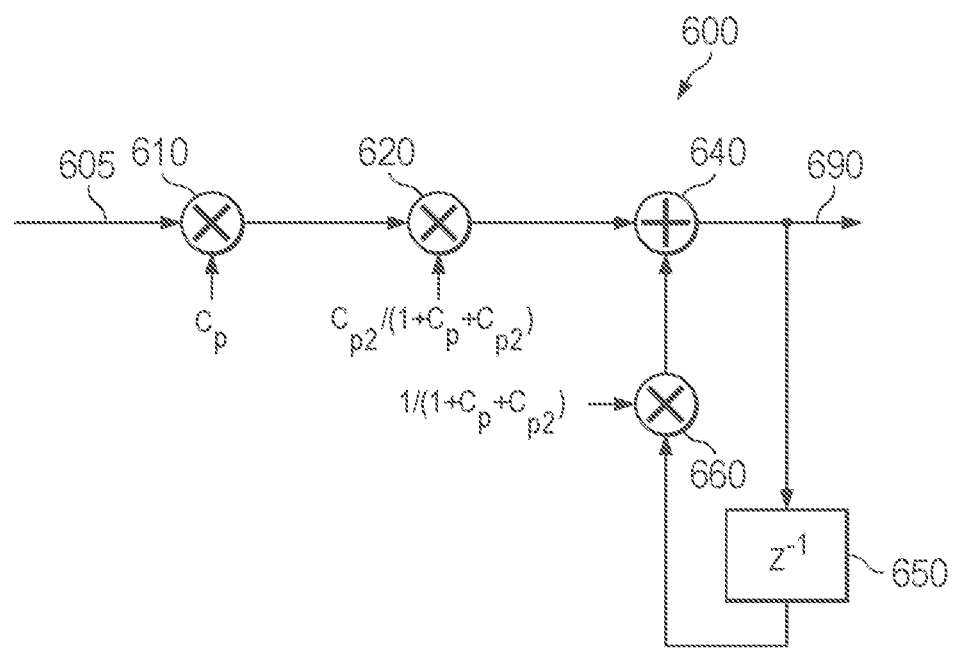
FIG. 6 illustrates another of various examples of a loop filter.

FIG. 6 illustrates one of various examples of a loop filter 600. Loop filter 600 may represent one of various examples of loop filter 140 as illustrated in FIG. 1. Input signal 605, which may be the phase difference output of phase detector 120 as illustrated in FIG. 1, may be provided to loop filter 600. Input signal 605 may be coupled to a first gain circuit 610. The output of first gain circuit 610 may be coupled to second gain circuit 620. The output of second gain circuit 620 may be coupled to a first input of adder 640. Adder 640 may be part of an integrator, the integrator including adder 640 and a feedback path comprising delay circuit 650 and third gain circuit 660. The output of adder 640 may be coupled to the input of delay circuit 650. The output of delay circuit 650 may be coupled to third gain circuit 660, and the output of third gain circuit 660 may be coupled to a second input of adder 640. The output of adder 640 may be loop filter output 690.

Adder 640, delay circuit 650 and third gain circuit 660 may comprise integrator 680.

In the example illustrated in FIG. 6, first gain circuit 610 may apply a gain setting of $C_p$. Second gain circuit 620 may apply a gain setting of $$\frac{c_{p2}}{1+c_p+c_{p2}}.$$

Third gain circuit 660 may apply a gain setting of $$\frac{1}{1+c_p+c_{p2}}.$$

The value of $C_{p2}$ may define a second pole in the response of loop filter 600 and may define a frequency at which the loop filter 600 rolls off at a 40 dB/decade rate.

Figure 7:
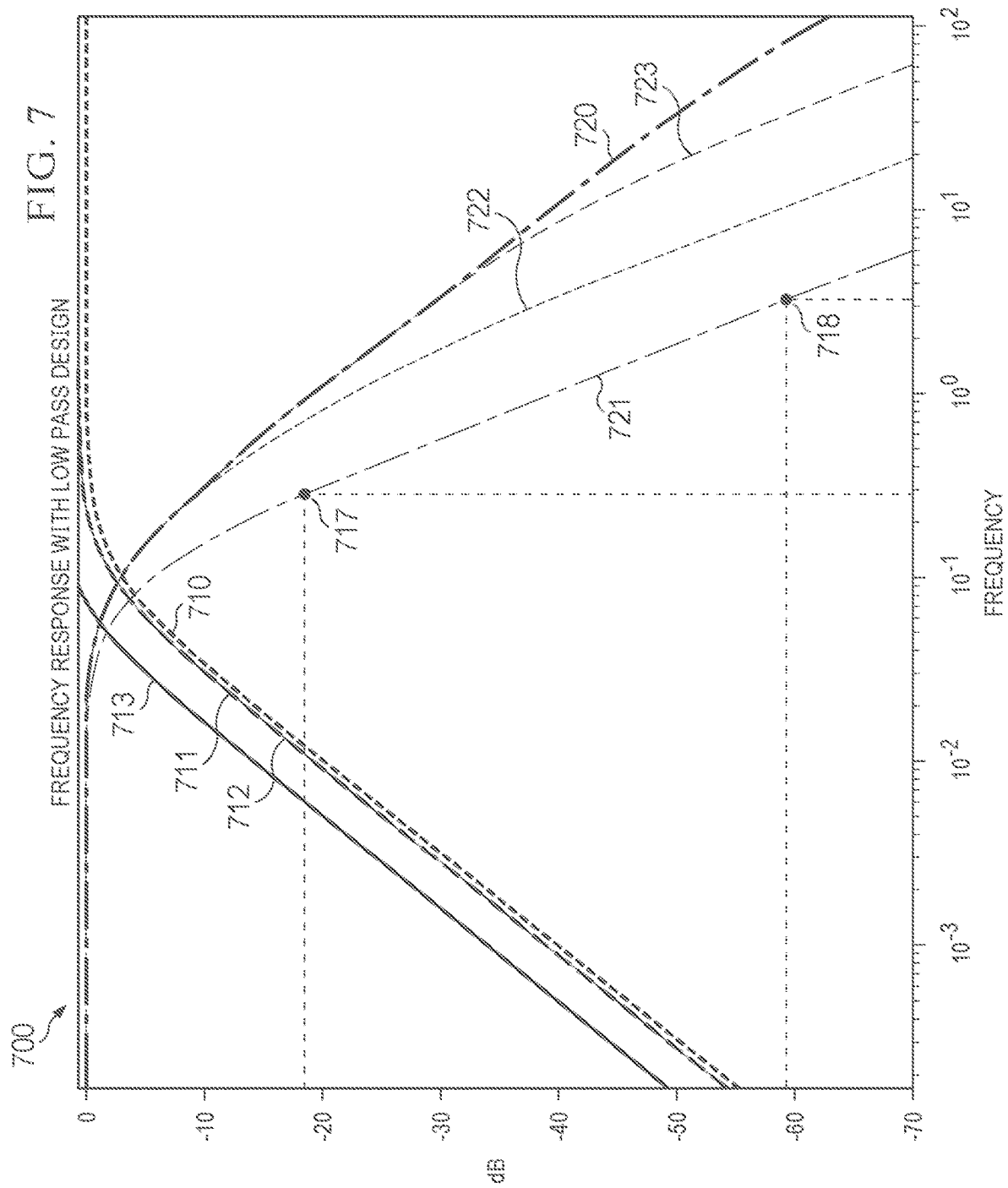
FIG. 7 illustrates one of various examples of a frequency response of a phase lock circuit.

FIG. 7 illustrates one of various examples of a frequency response 700. Frequency response 700 may represent the response of one of various examples of phase lock circuit 100 as described in reference to FIG. 1, the phase lock circuit 100 including loop filter 600 as described in reference to FIG. 6.

Traces 710, 711, 712 and 713 may illustrate a frequency response of noise from controllable oscillator circuit 130, as measured at controllable oscillator output 190, for different implementations of loop filter 600. Traces 710, 711, 712, and 713 may illustrate a frequency response for a loop filter 600 with different values of coefficients $C_p$ and $C_{p2}$. Loop filter 600 may apply a high-pass response to noise from the local oscillator 135 and may attenuate low-frequency noise from the local oscillator 135. Traces 720, 721, 722 and 723 may illustrate a frequency response of noise from reference signal 110, as measured at controllable oscillator output 190, for different implementations of loop filter 600. Traces 720, 721, 722 and 723 may illustrate a frequency response for loop filter 600 with different values of coefficients $C_p$ and $C_{p2}$. Loop filter 600 may apply a low-pass response to noise from reference signal 110 and may attenuate high-frequency noise from reference signal 110.

Loop filter 600 may apply attenuation with a 40 dB-per-decade roll-off in the controllable oscillator output 190 to noise from reference signal 110, as indicated by points 717 and 718 in FIG. 7. Point 717 illustrates the response of trace 721 at a frequency of $3*10^{-1}$ Hz, and point 718 illustrates the response of trace 721 at a frequency one decade higher, at $3*10^0$ Hz. The response is approximately −18 dB at point 717, and approximately −58 dB at point 718, which illustrates the 40 dB-per-decade roll-off of loop filter 600.

Figure 8:
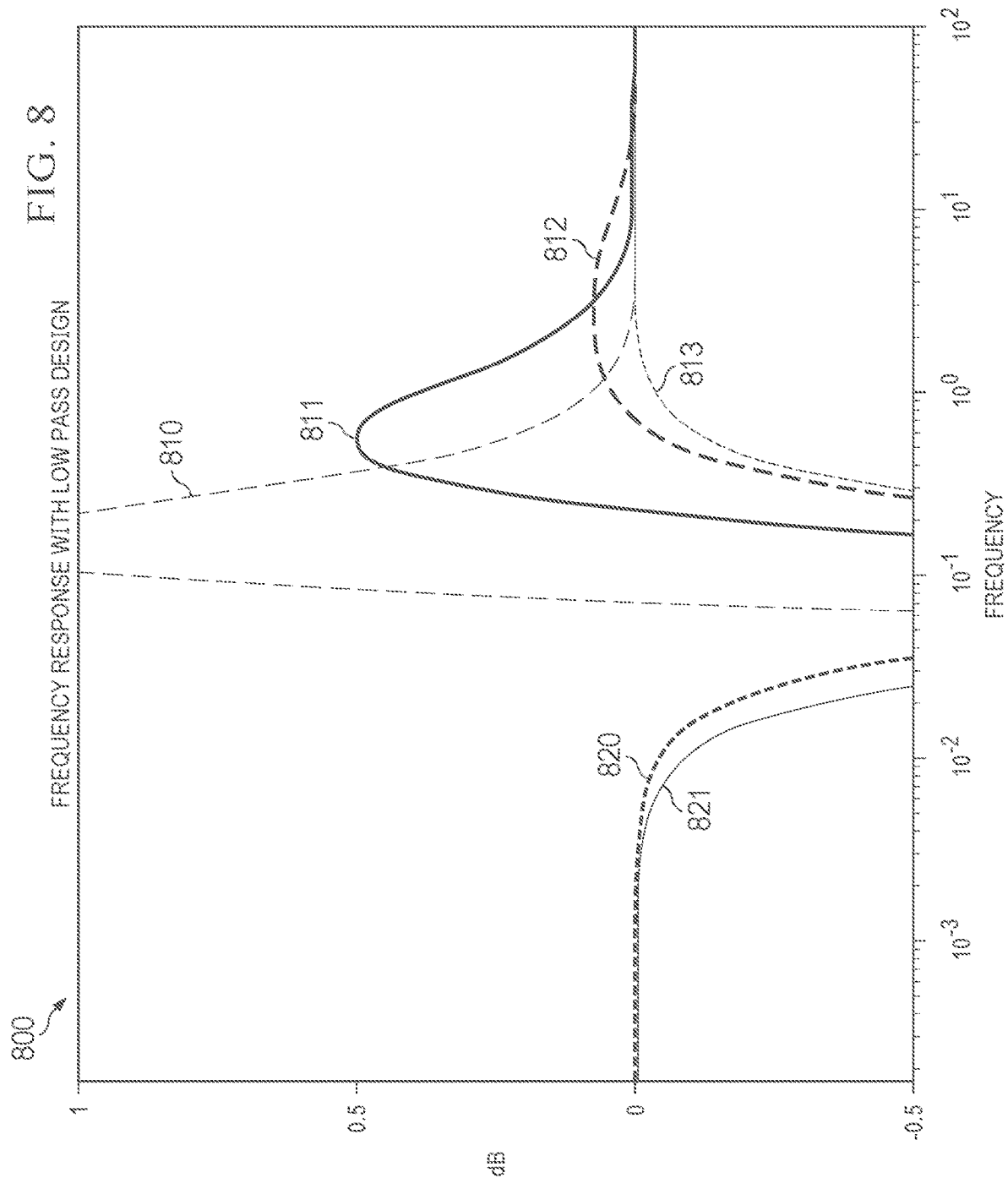
FIG. 8 illustrates a zoomed-in view of the frequency response of FIG. 7.

FIG. 8 illustrates a zoomed-in view 800 of frequency response 700. Note that the vertical axis in FIG. 8 spans −0.5 dB to 1 dB, where the vertical axis in FIG. 7 spans −70 dB to +2 dB. Traces 820 and 821 illustrate varying levels of roll-off in the frequency response for noise from the local oscillator 135 for different implementations of loop filter 600. Traces 810, 811, 812 and 813 illustrate varying levels of overshoot in the frequency response for noise from controllable oscillator circuit 130 for different implementations of loop filter 600. Different values for the gain settings in first gain circuit 610, second gain circuit 620 and third gain circuit 660 may result in different overshoot and roll-off characteristics.

Figure 9:
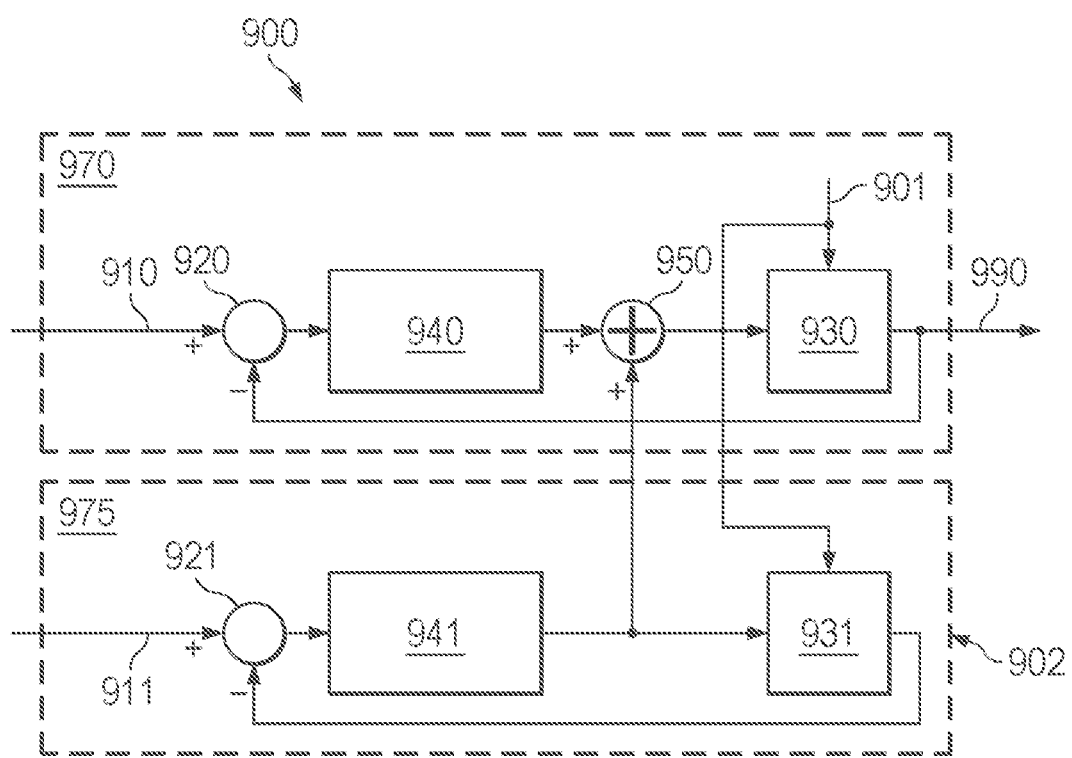
FIG. 9 illustrates one of various examples of a dual phase lock system.

FIG. 9 illustrates one of various examples of a dual phase lock system 900 including a first phase lock circuit 970 and a second phase lock circuit 975. First phase lock circuit 970 may receive reference signal 910 as an input to first phase lock circuit 970. Reference signal 910 may be input to the positive input of first phase detector circuit 920. The output of first controllable oscillator circuit 930 may be input to the negative input of first phase detector circuit 920. The output of first phase detector circuit 920 may be coupled to the input of first loop filter 940. The output of first phase detector circuit 920 may be a first phase difference output. First loop filter 940 may be a loop filter as described in reference to FIG. 3 or FIG. 6, or first loop filter 940 may be a different implementation of a loop filter. First loop filter 940 may be a frequency-selective filter. The filter order and coefficients of first loop filter 940 may set a specific frequency-selective roll-off and may determine the bandwidth of dual phase lock system 900.

The output of first loop filter 940 may be coupled to a first input of adder 950. The output of adder 950 may be coupled to a first input of first controllable oscillator circuit 930. The second input of first controllable oscillator circuit 930 may be coupled to a first oscillator signal 901. First oscillator signal 901 may also be termed a local oscillator signal. First oscillator signal 901 may be generated by a low-cost Crystal Oscillator (XO). The output of first controllable oscillator circuit 930 may be dual phase lock system output 990. Dual phase lock system output 990 may also be termed a phase lock output.

Second phase lock circuit 975 may receive second oscillator signal 911 as an input to second phase lock circuit 975. Second oscillator signal 911 may be generated by a stable Oven-Controlled Crystal Oscillator (OCXO), a Temperature-Controlled Oscillator (TCXO), or another type of stable oscillator not specifically mentioned. Second oscillator signal 911 may be input to the positive input of second phase detector circuit 921. The output of second controllable oscillator circuit 931 may be input to the negative input of second phase detector circuit 921. The output of second controllable oscillator 931 may be an oscillation signal. The output of second phase detector circuit 921 may be coupled to the input of second loop filter 941. Second loop filter 941 may be a loop filter as described in reference to FIG. 3 or FIG. 6, or second loop filter 941 may be a different implementation of a loop filter. Second loop filter 941 may be a frequency-selective filter. The filter order and coefficients of second loop filter 941 may set a specific frequency-selective roll-off and may determine the bandwidth of dual phase lock system 900.

The output of second loop filter 941 may be coupled to a first input of second controllable oscillator circuit 931. The second input of second controllable oscillator circuit 931 may be coupled to the first oscillator signal 901. The output of second loop filter 941 may be coupled to the second input of adder 950.

In operation, first loop filter 940 may be a loop filter with a predetermined frequency response. In operation, second loop filter 941 may be a loop filter with a predetermined frequency response. Dual phase lock system 900 may apply low-pass filtering to noise from reference signal 910. Dual phase lock system 900 may apply high-pass filtering to noise from first oscillator signal 901. Dual phase lock system 900 may apply band-pass filtering to noise from second oscillator signal 911.

Figure 10:
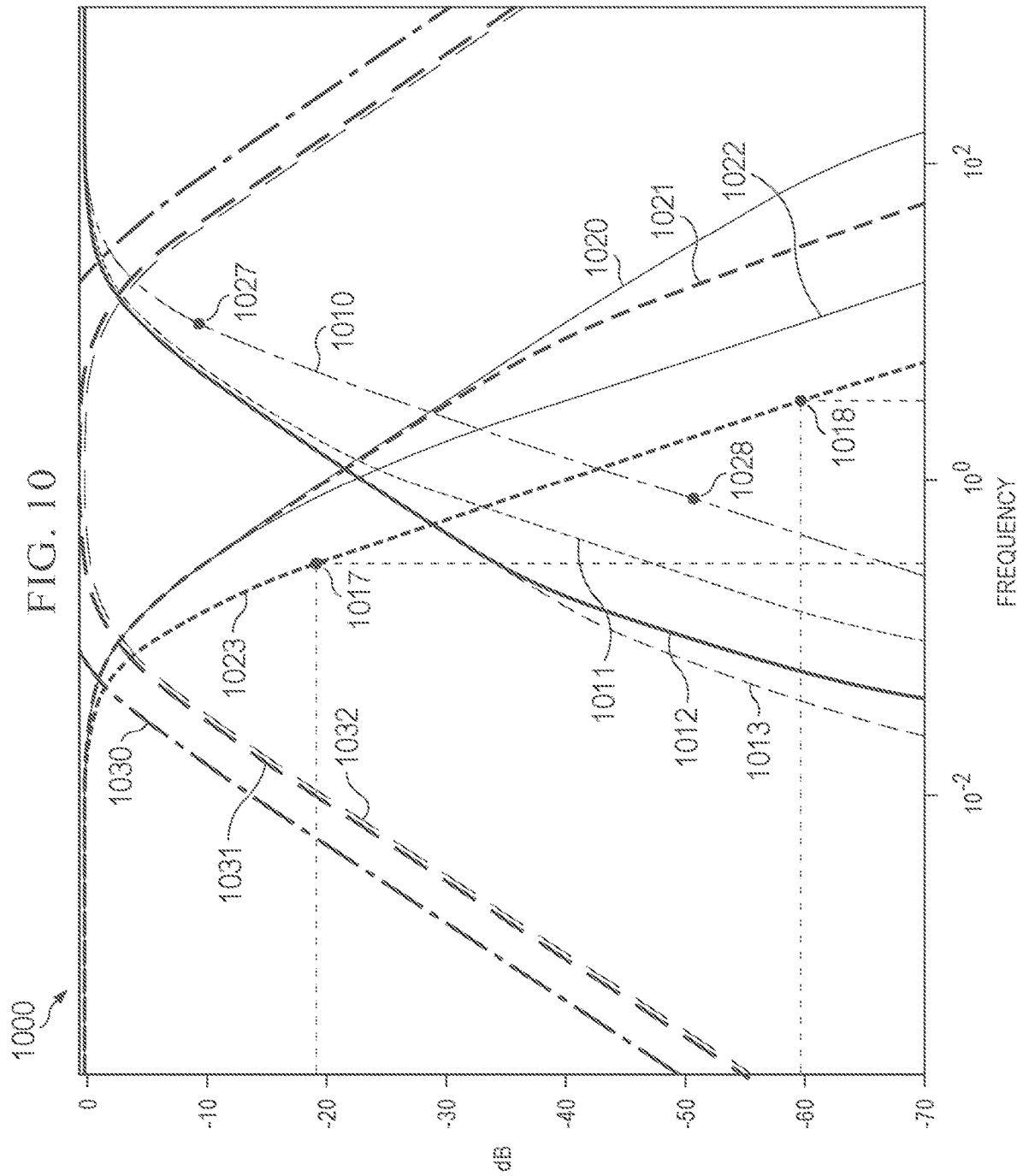
FIG. 10 illustrates one of various examples of a frequency response of a dual phase lock system.

FIG. 10 illustrates one of various examples of a frequency response 1000. Frequency response 1000 may represent the response of one of various examples of dual phase lock system 900 as described in reference to FIG. 9.

Traces 1020, 1021, 1022 and 1023 may illustrate a frequency response of noise from reference signal 910, as measured at dual phase lock system output 990, for different implementations of first loop filter 940 and second loop filter 941. First loop filter 940 and second loop filter 941 may apply a low-pass response to noise from reference signal 910 and may attenuate high-frequency noise from reference signal 910.

Traces 1010, 1011, 1012 and 1013 may illustrate a frequency response of noise from first oscillator signal 901, as measured at dual phase lock system output 990, for different implementations of first loop filter 940 and second loop filter 941. First loop filter 940 and second loop filter 941 may apply a high-pass response to noise from first oscillator signal 901 and may attenuate low-frequency noise from first oscillator signal 901.

Traces 1030, 1031, and 1032 may illustrate a frequency response of noise from second oscillator signal 911, as measured at dual phase lock system output 990, for different implementations of first loop filter 940 and second loop filter 941. First loop filter 940 and second loop filter 941 may apply a band-pass response to noise from second oscillator signal 911 and may attenuate high-frequency noise and low-frequency noise from second oscillator signal 911.

First loop filter 940 and second loop filter 941 may apply attenuation with a 40 dB-per-decade roll-off for noise from reference signal 910, as indicated by points 1017 and 1018 in FIG. 10. Point 1017 illustrates the response of trace 1023 at a frequency of $3*10^{-1}$ Hz, and point 1018 illustrates the response of trace 1023 at a frequency one decade higher, at $3*10^0$ Hz. The response is approximately −18 dB at point 1017, and approximately −58 dB at point 1018, which illustrates the 40 dB-per-decade roll-off of the combined response of first loop filter 940 and second loop filter 941. A similar 40-dB-per-decade roll-off in trace 1011 is illustrated between points 1027 and 1028 for noise from first oscillator signal 901. Dashed lines from points 1027 and 1028 to the figure axes have been omitted to improve readability of the figure.

Figure 11:
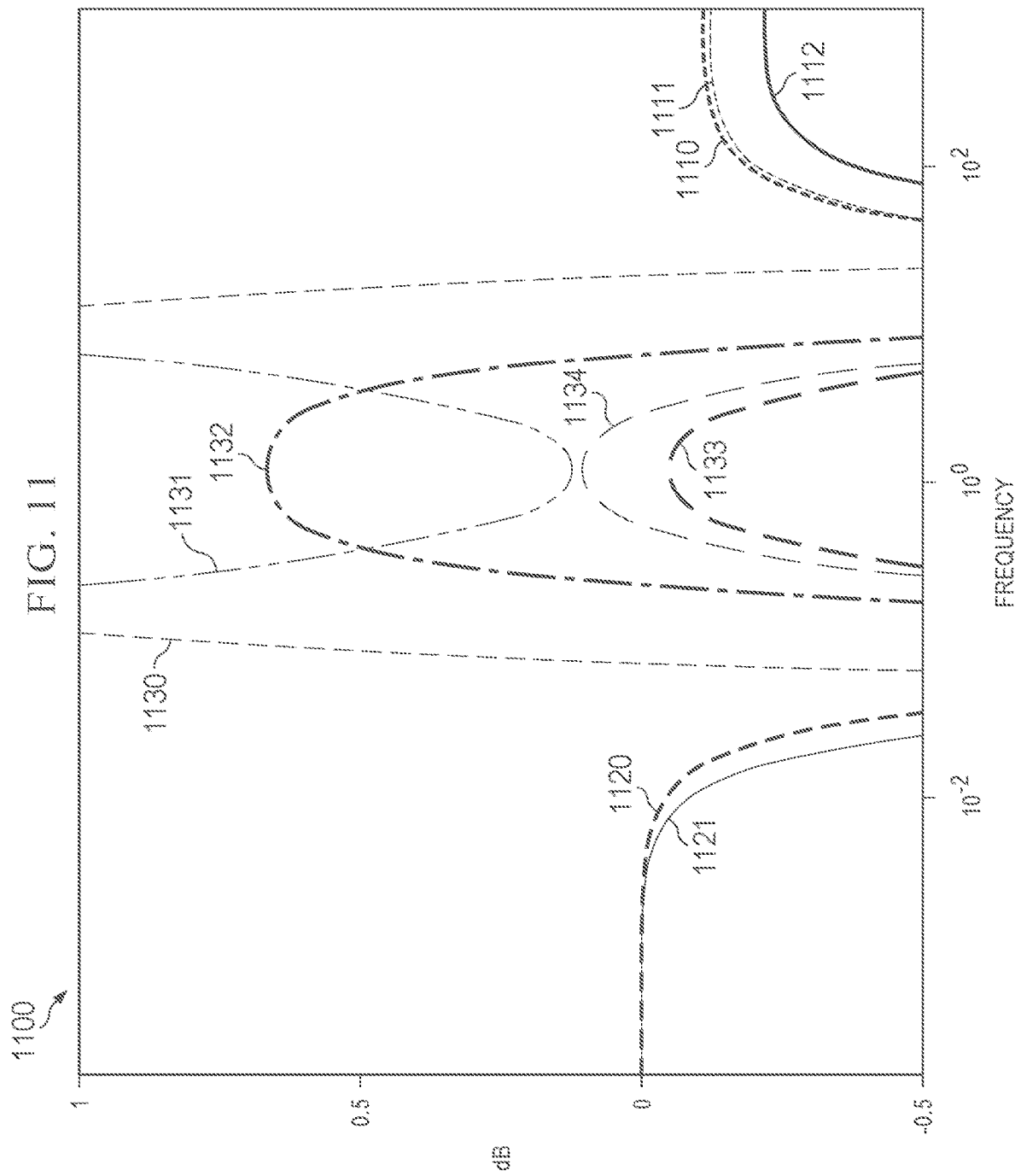
FIG. 11 illustrates a zoomed-in view of the frequency response of FIG. 10.

FIG. 11 illustrates a zoomed-in view 1100 of frequency response 1000. Note that the vertical axis in FIG. 11 spans −0.5 dB to 1 dB, where the vertical axis in FIG. 7 spans −70 dB to +2 dB. Traces 1120 and 1121 illustrate varying levels of roll-off in the frequency response for noise from reference signal 910 for different implementations of first loop filter 940 and second loop filter 941. Traces 1130, 1131, 1132, 1133 and 1134 illustrate varying levels of overshoot in the frequency response for noise from second oscillator signal 911 for different implementations of first loop filter 940 and second loop filter 941. Traces 1110, 1111, and 1112 illustrate varying levels of roll-off in the frequency response for noise from first oscillator signal 901 for different implementations of first loop filter 940 and second loop filter 941.

Figure 12:
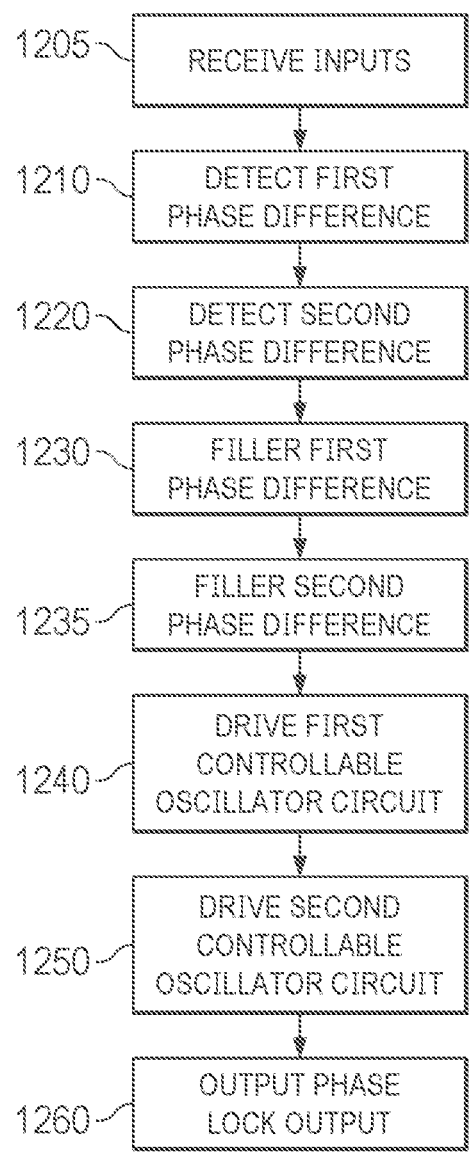
FIG. 12 illustrates a method of generating an oscillation signal.

FIG. 12 illustrates a method of generating an oscillation signal.

At operation 1205, a reference signal, a first oscillator signal and a second oscillator signal may be received as inputs.

At operation 1210, a first phase difference may be detected between the reference signal and the output of a first controllable oscillator circuit to generate a first phase difference, e.g., by first phase detector circuit 920.

At operation 1220, a second phase difference may be detected between the second oscillator signal and the output of a second controllable oscillator circuit to generate a second phase difference, e.g., by second phase detector circuit 921.

At operation 1230, the first phase difference may be filtered with a first frequency-selective filter, e.g., by first loop filter 940. At operation 1235, the second phase difference may be filtered with a second frequency-selective filter, e.g., by second loop filter 941.

At operation 1240, the first controllable oscillator circuit may be driven with the first oscillator signal and the output of an adder, e.g., the first controllable oscillator circuit 930 may be driven by the output of adder 950. The adder may add the output of the first frequency-selective filter and the output of the second frequency-selective filter. The output of the adder may modify at least one of the phase and frequency of the output oscillator signal of the first controllable oscillator circuit.

At operation 1250, the second controllable oscillator circuit may be driven with the first oscillator signal and the output of the second frequency-selective filter, e.g., the second controllable oscillator circuit 931 may be driven by the first oscillator signal 901 and the output of second loop filter 941. The output of the second frequency-selective filter may modify at least one of the phase and frequency of the output oscillator signal of the second controllable oscillator circuit.

At operation 1260, the output of the first controllable oscillator circuit may be provided as a phase-lock output.

The invention claimed is:

1. A device comprising:
a controllable oscillator circuit to generate an oscillation signal, the controllable oscillator circuit to receive input from a local oscillator;
a phase detector circuit to generate a phase difference output based upon a first input and a second input, the first input coupled to a reference signal, and the second input coupled to the oscillation signal generated by the controllable oscillator circuit;
a loop filter with a frequency-selective roll-off to filter the phase difference output to generate a filtered phase difference output;
a multiplier to apply a gain setting to the filtered phase difference output;
an integrator to integrate the output of the multiplier, and
an adder to sum the filtered phase different output and the output of the integrator, wherein:
the controllable oscillator circuit modifies at least one of a phase and a frequency of the oscillation signal based upon the output of the adder.

2. The device as claimed in claim 1, the loop filter to receive an input signal, the input signal coupled to a first gain circuit, a second gain circuit, and a third gain circuit, wherein the output of the first gain circuit is coupled to a first input of a first adder, the output of the second gain circuit is coupled to a first input of a second adder, and the output of the third gain circuit is coupled to an integrator input, the integrator output is coupled to a second input of the second adder, the output of the second adder is coupled to a second input of the first adder, and the output of the first adder is coupled to the loop filter output.

3. The device as claimed in claim 2, the loop filter to attenuate noise in the reference signal.

4. The device as claimed in claim 2, the loop filter to attenuate noise in the input from the local oscillator.

5. The device as claimed in claim 2, the first gain circuit to apply a first gain setting, the second gain circuit to apply a second gain setting, and the third gain circuit to apply a third gain setting.

6. The device as claimed in claim 1, the loop filter to receive an input signal, the input signal coupled to a first gain circuit, the output of the first gain circuit coupled to a second gain circuit, the output of the second gain circuit coupled to an integrator, the integrator comprising an adder, a feedback path comprising a delay circuit in series with a third gain circuit, wherein the output of the second gain circuit is coupled to a first input of the adder, the output of the third gain circuit is coupled to the second input of the adder, and the loop filter output is coupled to the output of the adder.

7. The device as claimed in claim 6, the loop filter to attenuate noise in the reference signal.

8. The device as claimed in claim 6, the loop filter to attenuate noise in the input from the local oscillator.

9. The device as claimed in claim 6, the first gain circuit to apply a first gain setting, the second gain circuit to apply a second gain setting, and the third gain circuit to apply a third gain setting.

10. A system comprising:
a first controllable oscillator circuit to generate a phase lock output;
a first phase detector circuit to generate a first phase difference output based upon a first input and a second input, the first input coupled to a reference signal and the second input coupled to the output of the first controllable oscillator circuit;
a first loop filter with a frequency-selective roll-off to filter the first phase difference output to generate a first filtered phase difference output, and wherein:
the first controllable oscillator circuit to modify at least one of a phase and a frequency of a first oscillator signal based upon a sum of the first filtered phase difference output and a second filtered phase difference output;
a second controllable oscillator circuit to generate an oscillation signal at an output of the second controllable oscillator circuit;
a second phase detector circuit to generate a second phase difference output based upon a first input and a second input, the first input to receive a second oscillator signal and the second input coupled to the output of the second controllable oscillator circuit, and
a second loop filter with a frequency-selective roll-off to filter the second phase difference output to generate the second filtered phase difference output, wherein:
the second controllable oscillator circuit modifies at least one of a phase and a frequency of the first oscillator signal based upon the second filtered phase difference output.

11. The system as claimed in claim 10, the first frequency-selective filter comprising a low-pass filter and the second frequency-selective filter comprising a low-pass filter.

12. The device as claimed in claim 10, the first loop filter to receive an input signal, the input signal coupled to a first gain circuit, a second gain circuit, and a third gain circuit, wherein the output of the first gain circuit is coupled to a first input of a first adder, the output of the second gain circuit is coupled to a first input of a second adder, and the output of the third gain circuit is coupled to an integrator input, the integrator output coupled to a second input of the second adder, the output of the second adder coupled to a second input of the first adder, and the output of the first adder coupled to the first loop filter output.

13. The device as claimed in claim 10, the second loop filter to receive an input signal, the input signal coupled to a first gain circuit, the output of the first gain circuit coupled to a second gain circuit, the output of the second gain circuit coupled to an integrator, the integrator comprising an adder, a feedback path comprising a delay circuit in series with a third gain circuit, wherein the output of the second gain circuit is coupled to a first input of the adder, the output of the third gain circuit is coupled to the second input of the adder, and the second loop filter output is coupled to the output of the adder.

14. A method comprising:
receiving input from a reference signal, a first oscillator signal and a second oscillator signal;
detecting a first phase difference between the reference signal and an output oscillation signal of a first controllable oscillator circuit to generate a first phase difference;

detecting a second phase difference between the second oscillator signal and an output oscillation signal of a second controllable oscillator circuit to generate a second phase difference;

filtering the first phase difference with a first frequency-selective filter;

filtering the second phase difference with a second frequency-selective filter;

driving the first controllable oscillator circuit with the first oscillator signal and an output of an adder, the adder to add outputs of the first frequency-selective filter and the second frequency-selective filter, and the output of the adder to modify at least one of a phase and a frequency of the output oscillation signal of the first controllable oscillator circuit;

driving the second controllable oscillator circuit with the first oscillator signal and the output of the second frequency-selective filter, the output of the second frequency-selective filter to modify at least one of a phase and a frequency of the output oscillation signal of the second controllable oscillator circuit, and outputting the output oscillation signal of the first controllable oscillator circuit as a phase lock output.

15. The method as claimed in claim 14, the first frequency-selective filter comprising a low-pass filter.

16. The method as claimed in claim 14, the second frequency-selective filter comprising a low-pass filter.

\* \* \* \* \*